(12) United States Patent
Wang

(10) Patent No.: US 10,748,839 B2
(45) Date of Patent: *Aug. 18, 2020

(54) PACKAGE STRUCTURE OF A FOLDING MAGNETIC COUPLING ISOLATOR, LEADFRAME COMPONENT, AND LEADFRAME STRUCTURE

(71) Applicant: LITE-ON SINGAPORE PTE. LTD., Singapore (SG)

(72) Inventor: You-Fa Wang, Singapore (SG)

(73) Assignee: LITE-ON SINGAPORE PTE. LTD., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 16/689,234

(22) Filed: Nov. 20, 2019

(65) Prior Publication Data
US 2020/0091049 A1    Mar. 19, 2020

Related U.S. Application Data

(62) Division of application No. 16/107,497, filed on Aug. 21, 2018, now Pat. No. 10,529,657.

(30) Foreign Application Priority Data

Oct. 25, 2017  (CN) .......................... 2017 1 1031101

(51) Int. Cl.
*H01L 23/495* (2006.01)
*H01L 23/66* (2006.01)
*H01L 23/00* (2006.01)
*H01L 21/48* (2006.01)

(52) U.S. Cl.
CPC .... *H01L 23/49575* (2013.01); *H01L 21/4842* (2013.01); *H01L 23/49541* (2013.01); *H01L 23/49551* (2013.01); *H01L 23/66* (2013.01); *H01L 24/49* (2013.01); *H01L 2223/6661* (2013.01); *H01L 2224/48091* (2013.01); *H01L 2224/48151* (2013.01); *H01L 2924/00014* (2013.01); *H01L 2924/14* (2013.01)

(58) Field of Classification Search
CPC ......... H01L 23/49575; H01L 23/49541; H01L 23/49551
See application file for complete search history.

(56) References Cited

U.S. PATENT DOCUMENTS 10,510,728 B2 * 12/2019 Wang ................... H01L 25/0657
2008/0278256 A1 * 11/2008 Harvey ................. H01L 23/495
333/12

* cited by examiner

Primary Examiner — Quoc D Hoang
(74) Attorney, Agent, or Firm — Li & Cai Intellectual Property (USA) Office

(57) ABSTRACT

The present invention provides a leadframe component and a package structure. The leadframe component includes a first leadframe and a second leadframe. The first leadframe includes a first chip-mounting portion for carrying a first chip, a first coil portion, a plurality of first pins and a plurality of first floated pins. The second leadframe includes a second chip-mounting portion for carrying a second chip, a second coil portion, a plurality of second pins and a plurality of second floated pins. The first leadframe is disposed above or under the second leadframe for aligning the first coil portion with the second coil portion.

18 Claims, 8 Drawing Sheets providing a leadframe structure including a frame body, a first leadframe connected to the frame body and a second leadframe connected to the frame body, wherein the first leadframe includes a first chip-mounting portion, at least a first coil portion, a plurality of first pins and a plurality of floated pins, and the second leadframe includes a second chip-mounting portion, at least a second coil portion, a plurality of second pins and a plurality of second floated pins ~S100 respectively disposing at least a first chip and at least a second chip on the first chip-mounting portion and the second chip-mounting portion and enabling the first chip and the second chip to be electrically connected to the first pin portion and the second pin portion ~S102 rotating the first leadframe relative to the frame body for moving the first leadframe to a position above or under the second leadframe, thereby generating a height difference between the first leadframe and the second leadframe and electrically isolating the first leadframe from the second leadframe, the first coil portion and the second coil portion being aligned with each other and being magnetically coupled to each other ~S104

FIG. 3 providing a leadframe structure including a frame body, a first leadframe connected to the frame body and a second leadframe connected to the frame body, wherein the first leadframe includes a first chip-mounting portion, at least a first coil portion, a plurality of first pins and a plurality of floated pins, and the second leadframe includes a second chip-mounting portion, at least a second coil portion, a plurality of second pins and a plurality of second floated pins —S100 respectively disposing at least a first chip and at least a second chip on the first chip-mounting portion and the second chip-mounting portion and enabling the first chip and the second chip to be electrically connected to the first pin portion and the second pin portion —S102 forming at least a bending portion in the first leadframe —S103 rotating the first leadframe relative to the frame body for moving the first leadframe to a position above or under the second leadframe, thereby generating a height difference between the first leadframe and the second leadframe and electrically isolating the first leadframe from the second leadframe, the first coil portion and the second coil portion being aligned with each other and being magnetically coupled to each other —S104 forming an insulating package for packaging a first chip and the second chip and connecting the first leadframe to the second leadframe —S105 removing the frame body —S106

FIG. 4

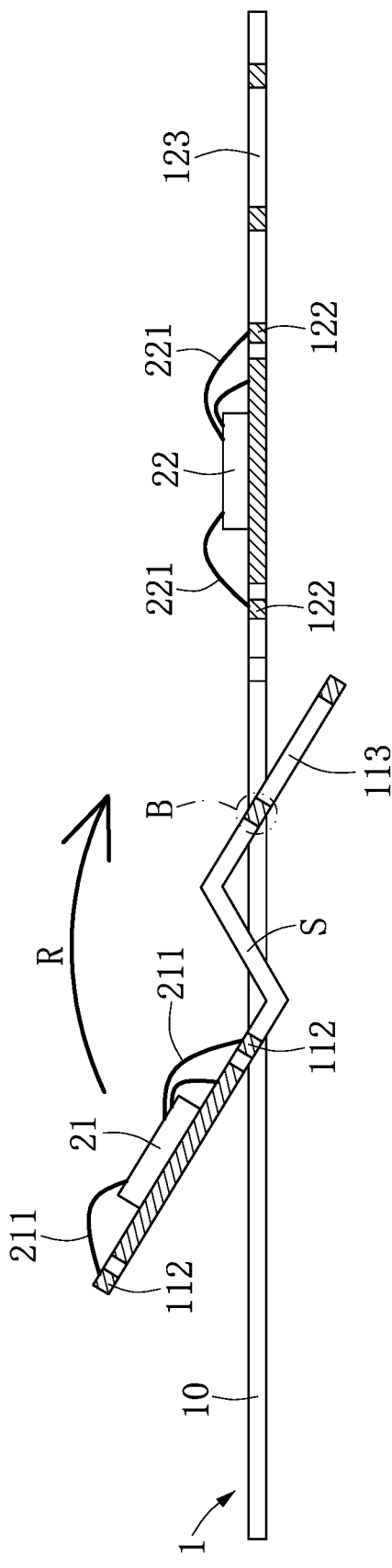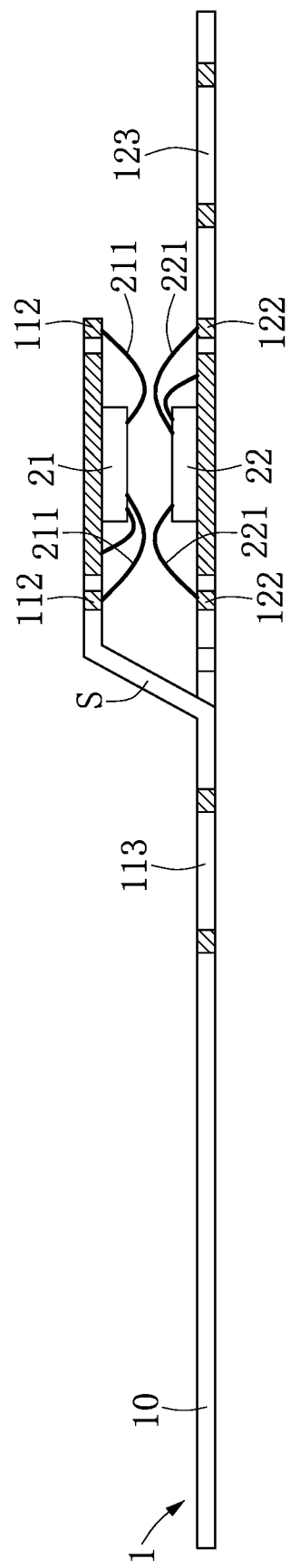

PACKAGE STRUCTURE OF A FOLDING MAGNETIC COUPLING ISOLATOR, LEADFRAME COMPONENT, AND LEADFRAME STRUCTURE

CROSS REFERENCE TO RELATED APPLICATIONS

This application is a divisional application of Ser. No. 16/107,497 filed on Aug. 21, 2018, and entitled "PACKAGE STRUCTURE OF FOLDING MAGNETIC COUPLING ISOLATOR AND LEADFRAME COMPONENT AND MANUFACTURING METHOD THEREOF", now pending, the entire disclosures of which are incorporated herein by reference.

BACKGROUND

1. Technical Field

The present disclosure relates to a leadframe structure, a leadframe component and a package structure of a folding magnetic coupling isolator including the same, and in particular, to a leadframe component formed by a single leadframe structure, and a package structure of a folding magnetic coupling isolator including the same.

2. Description of Related Art

Magnetic coupling isolators are commonly used in opto-isolator products. However, magnetic coupling isolation technique can also be used in common electronic components for integrating an isolator and a functional semiconductor component into a single semiconductor unit, such as a power management IC or a magnetic coupling CAN bus transceiver with magnetic coupling function.

SUMMARY

The main object of the present disclosure is to provide a foldable leadframe component and a package structure of a magnetic coupling isolator including the same. Therefore, a leadframe component (a "double leadframe component") can be formed by utilizing the specific design of the single leadframe structure and the folding (rotating) step. In addition, the coupling performance of the package structure of the magnetic coupling isolator including the double leadframe component can be adjusted by adjusting the dimensions of specific portions in the leadframe structure.

An advantage of the present disclosure resides in that, based on the technical features of "the first leadframe is disposed above or under the second leadframe for aligning the first coil and the second coil and enabling the first coil and the second coil to magnetically couple to each other" or "rotating the first leadframe relative to the frame body for moving the first leadframe to be above or under the second leadframe", the foldable leadframe component, and the package structure of a magnetic coupling isolator including the same provided by the present disclosure can improve the alignment accuracy of the first coil portion and the second coil portion, and control the magnetic coupling effect generated by the matching of the first coil portion and the second coil portion.

In order to further understand the techniques, means and effects of the present disclosure, the following detailed descriptions and appended drawings are hereby referred to, such that, and through which, the purposes, features and aspects of the present disclosure can be thoroughly and concretely appreciated; however, the appended drawings are merely provided for reference and illustration, without any intention to be used for limiting the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

FIG. 3 is a flow chart of a method for manufacturing a package structure of a magnetic coupling isolator of an embodiment of the present disclosure.

FIG. 4 is a flow chart of a method for manufacturing a package structure of a magnetic coupling isolator of another embodiment of the present disclosure.

FIG. 7 is a schematic view of another step in the method for manufacturing a package structure of a folding magnetic coupling isolator of an embodiment of the present disclosure.

FIG. 8 is a schematic view of yet another step in the method for manufacturing a package structure of a folding magnetic coupling isolator of an embodiment of the present disclosure.

DESCRIPTION OF THE EXEMPLARY EMBODIMENTS

Figure 1:
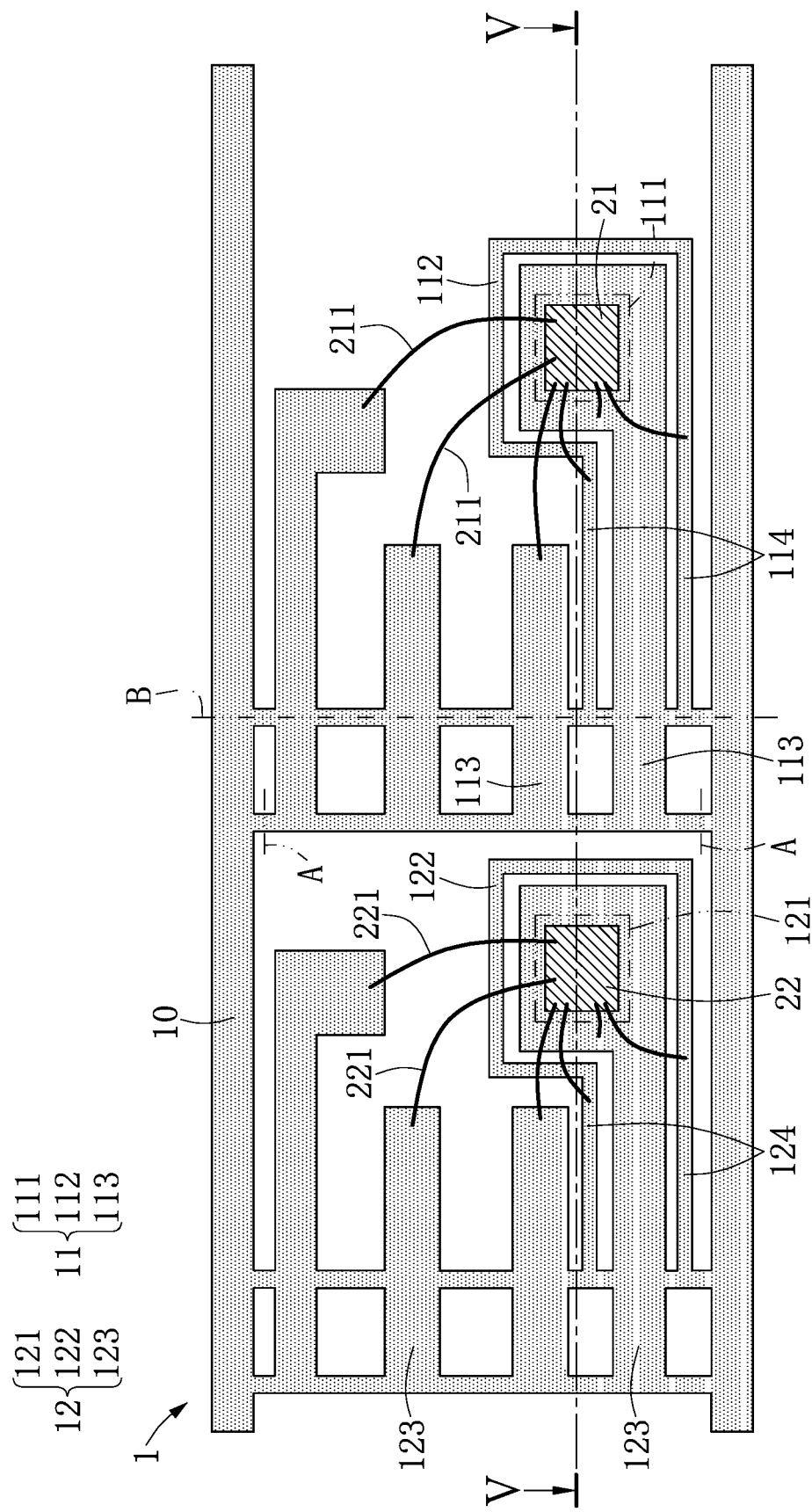
FIG. 1 is a top view of a leadframe structure used in an embodiment of the present disclosure.

Reference will now be made in detail to the exemplary embodiments of the present disclosure, examples of which are illustrated in the accompanying drawings. Wherever possible, the same reference numbers are used in the drawings and the description to refer to the same or like parts.

Figure 2:
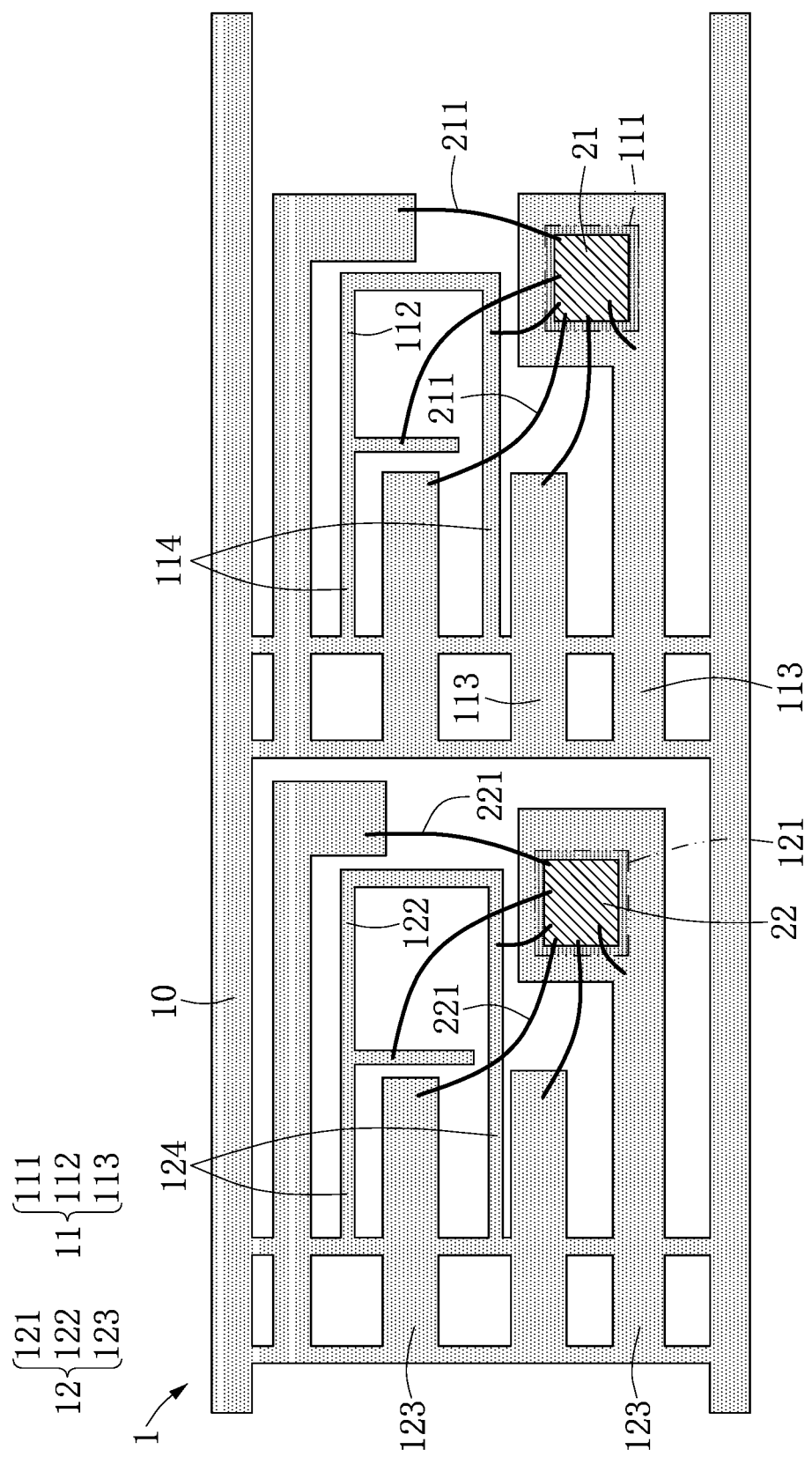
FIG. 2 is a top view of a leadframe structure used in another embodiment of the present disclosure.

Reference is made to FIG. 1 and FIG. 2. The method for manufacturing a package structure of a folding magnetic coupling isolator provided by the present disclosure can be performed using a single lead frame structure 1. Specifically, a leadframe structure and a package structure of a folding magnetic coupling isolator can be formed under simple manufacturing steps by using the lead frame structure 1 shown in FIG. 1 and FIG. 2. Meanwhile, the accuracy of alignment and the electrical insulation between a pair of coils in the leadframe and the package structure can be ensured.

As shown in FIG. 1 and FIG. 2, the lead frame structure 1 used in the present disclosure includes a frame body 10, a first leadframe 11 and a second leadframe 12 both connected to the frame body 10. The first leadframe 11 includes a first chip-mounting portion 111, a first coil portion 112, a plurality of first pins 113 and a plurality of first floated pins 114. The second leadframe 12 includes a second chip-mounting portion 121, a second coil portion 122, a plurality of second pins 123 and a plurality of second floated pins 124. The frame body 10, the first leadframe 11 and the second leadframe 12 can be formed by conductive materials such as metals. The frame body 10, the first leadframe 11 and the second leadframe 12 can be made from same or different materials.

The first coil portion 112 and the second coil portion 122 can be formed by metal frames or metal rings connected to the lead frame structure 1. The first coil portion 112 and the second coil portion 122 can each include a single coil or a plurality of coils. The first coil portion 112 and the second coil portion 122 are respectively connected to the first floated pin 114 and the second floated pin 124. The first floated pins 114 are used to support the first coil portion 112, and the second floated pins 124 are used to support the second coil portion 122. In addition, in the present disclosure, the numbers of the first coil portion 112 and the second coil portion 122 are not limited. For example, the first leadframe 11 can include two first coil portions 112 symmetrically located therein, and the second leadframe 12 can include two second coil portions 122 symmetrically located therein. Specifically, the two first coil portions 112 can be located at two opposite sides of the first chip-mounting portion 111, and the two second coil portions 122 can be located at two opposite sides of the second chip-mounting portion 121, thereby forming two electrical signal channels.

It should be noted that in addition to the lead frame structure 1, a first chip 21 disposed on the first chip-mounting portion 111, a second chip 22 disposed on the second chip-mounting portion 121, a plurality of first connecting wires 211 and a plurality of second connecting wires 221 respectively providing electrical connection to the first chip 21 and the second chip 22 are shown in FIG. 1. In addition, the main difference between FIG. 1 and FIG. 2 is that the positions of the first chip-mounting portion 111 and the first coil portion 112 in the first leadframe 11, and the second chip-mounting portion 121 and the second coil portion 122 in the second leadframe 12 are different.

Referring to FIG. 1, in an embodiment of the present disclosure, the first chip-mounting portion 111 in the first leadframe 11 is surrounded by the first coil portion 112, and the first chip-mounting portion 111 and the first coil portion 112 are connected to the frame body 10 through the first floated pins 114. Similarly, the second chip-mounting portion 121 in the second leadframe 12 is surrounded by the second coil portion 122, and the second chip-mounting portion 121 and the second coil portion 122 are connected to the frame body 10 through the second floated pins 124.

As shown in FIG. 2, in another embodiment of the present disclosure, the first chip-mounting portion 111 and the first coil portion 112 in the first leadframe 11 are separated from and adjacent to each other, and the second chip-mounting portion 121 and the second coil portion 122 in the second leadframe 12 are separated from and adjacent to each other. In the present disclosure, the relative position between the first chip-mounting portion 111 and the first coil portion 112, and the relative position between the second chip-mounting portion 121 and the second coil portion 122 can be adjusted based on the needs of the products and are not limited in the present disclosure.

In other words, as long as the first coil portion 112 and the second coil portion 122 are matched and are able to transmit signals through electrical magnetic coupling, the relative position between the first chip-mounting portion 111 and the first coil portion 112, and the relative position between the second chip-mounting portion 121 and the second coil portion 122 are not limited in the present disclosure. However, the arrangement of the first chip-mounting portion 111, the first coil portion 112, the second chip-mounting portion 121 and the second coil portion 122 shown in FIG. 1 can effectively reduce the overall size of the leadframe component or the package structure formed thereby while achieving a maximum coil area. Therefore, preferably, the first coil portion 112 surrounds the first chip-mounting portion 111 and the second coil portion 122 surrounds the second chip-mounting portion 121.

In addition, in other embodiments of the present disclosure, the first coil portion 112 and the second coil portion 122 can further be supported by at least a portion of the chip-mounting portions, thereby further reducing the overall size of the product.

Reference is made to FIG. 1 and FIG. 2. A plurality of first connecting wires 211 and a plurality of second connecting wires 221 are respectively disposed on the first leadframe 11 and the second leadframe 12. Based on the plurality of first connecting wires 211 and the plurality of second connecting wires 221, the first chip-mounting portion 111 and the first coil portion 112 are electrically connected to each other to form a closed circuit (using two first connecting wires 211 and two second connecting wires 221 shown in FIG. 1), and the first chip-mounting portion 111 and the second chip-mounting portion 121 can respectively be electrically connected to the first pin portion 113 and the second pin portion 123 for forming closed circuits by the other first connecting wires 211 and second connecting wires 221 (such as the other four first connecting wires 211 and the other four second connecting sires 221 shown in FIG. 1).

In the present disclosure, the numbers and the shapes of the first pins 113 and the second pins 123 can be designed and adjusted based on the needs of the products and are not limited in the present disclosure. In addition, the connection manners and structures of the first connecting wires 211 and the second connecting wires 221 are not limited in the present disclosure and can be varied by those skilled in the art based on their professional knowledge.

Reference is made to FIG. 3 and FIG. 4. FIG. 3 and FIG. 4 show flow charts of the methods provided by different embodiments of the present disclosure. As shown in FIG. 3, the method for manufacturing the package structure of magnetic coupling structure includes a step of providing a leadframe structure including a frame body, a first leadframe connected to the frame body and a second leadframe connected to the frame body (step S100). The first leadframe includes a first chip-mounting portion, a first coil portion, a plurality of first pins and a plurality of first floated pins. The second leadframe includes a second chip-mounting portion, a second coil portion, a plurality of second pins and a plurality of second floated pins. The method further includes the following steps: respectively disposing at least a first chip and at least a second chip on the first chip-mounting portion and the second chip-mounting portion and enabling the first chip and the second chip to be electrically connected to the first pin portion and the second pin portion (step S102); and rotating the first leadframe relative to the frame body for moving the first leadframe to a position above or under the second leadframe, thereby generating a height difference between the first leadframe and the second leadframe and electrically isolating the first leadframe from the second leadframe, the first coil portion and the second coil portion being aligned with each other and being magnetically coupled to each other (step S104).

Compared to the method for manufacturing the magnetic coupling package structure shown in FIG. 3, the method shown in FIG. 4 further includes step S103, step S105 and step S106. Specifically, the method shown in FIG. 4 includes: providing a leadframe structure including a frame body, a first leadframe connected to the frame body and a second leadframe connected to the frame body, in which the first leadframe includes a chip-mounting portion, a first coil portion, a plurality of first pins and a plurality of first floated pins, and the second leadframe includes a second chip-mounting portion, a second coil portion, a plurality of second pins and a plurality of second floated pins (step S100); disposing at least a first chip and at least a second chip on the first chip-mounting portion and the second chip-mounting portion and enabling the first chip and the second chip to be electrically connected to the first pin portion and the second pin portion (step S102); forming at least a bending portion in the first leadframe (step S103); rotating the first leadframe relative to the frame body, and moving the first leadframe to a position above or under the second leadframe for matching the first coil portion to the second coil portion (step S104); forming an insulating package for packaging a first chip and the second chip and connecting the first leadframe to the second leadframe (step S105); and removing the frame body (step S106).

It should be noted that in the method for manufacturing the magnetic coupling package structure, step S102 and step S103 are not necessarily performed in the above order. In other words, before rotating the first leadframe (step S104), the first chip 21 and the second chip 22 can be mounted before the formation of the bending portion, or the bending portion can be formed before disposing the first chip 21 and the second chip 22 on the first chip-mounting portion 111 and the second chip-mounting portion 121, respectively. For the purpose of illustration, step S102 is performed before step S103 in the following description.

Figure 5:
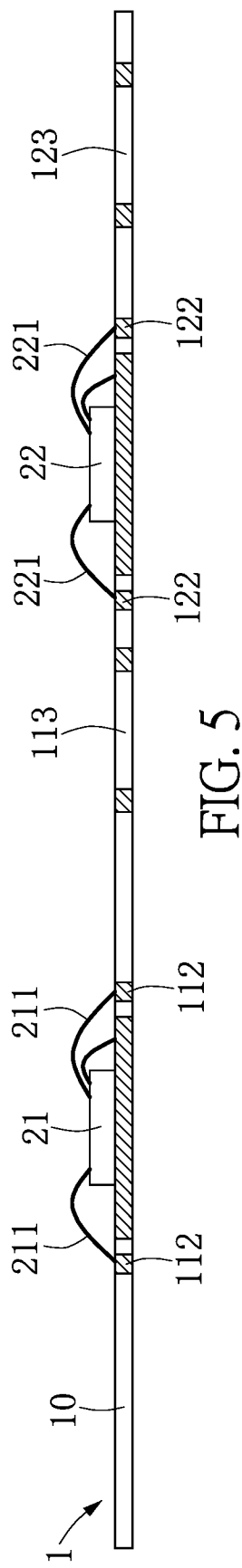
FIG. 5 is a partial sectional view obtained along line V-V in FIG. 1.
Figure 6:
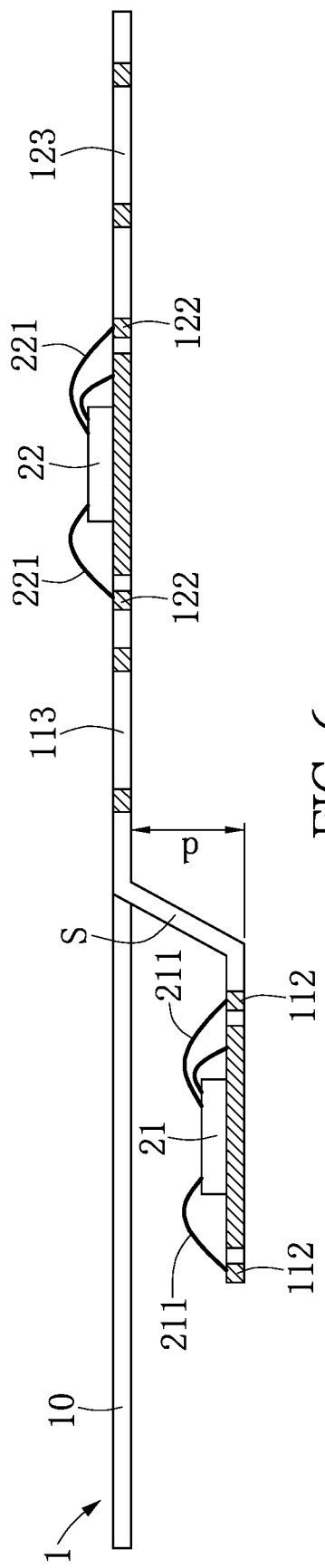
FIG. 6 is a schematic view of a step in a method for manufacturing a package structure of a folding magnetic coupling isolator of an embodiment of the present disclosure.

Reference is made to FIG. 1 and FIG. 5 to FIG. 8. FIG. 5 is a partial sectional schematic view taken along line V-V in FIG. 1, FIG. 6 is a schematic view of step S1013, FIG. 7 is a schematic view of step S104, and FIG. 8 is a schematic view of step 105. In step S100, a leadframe structure 1 is provided. The leadframe structure 1 can have a structure shown in FIG. 1 or FIG. 2 and include a frame body 10, a first leadframe 11 and a second leadframe 12. As shown in FIG. 5, the first leadframe 11 and the second leadframe 12 of the lead frame structure 1 are adjacent to each other and have similar structures. The first leadframe 11 includes a first chip-mounting portion 111, a first coil portion 112 and a first pin portion 113, and the second leadframe 12 includes a second chip-mounting portion 121, a second coil portion 122 and a second pin portion 123. In addition, the first leadframe 11 and the second leadframe 12 each includes a plurality of first floated pins 114 and a plurality of second floated pins 124.

Next, in step S102, the first chip 21 and the second chip 22 are respectively disposed on the first chip-mounting portion 111 and the second chip-mounting portion 121. Electrical connections are established between the first chip 21 and the first pin portion 113, and between the second chip 22 and the second pin portion 123. The number of the first chip 21 and the number of the second chip 22 are not limited in the present disclosure. In the embodiments shown in FIG. 1 and FIG. 2, the first leadframe 11 includes a first chip 21, and the second leadframe 12 includes a second chip 22. For example, the first chip 21 and the second chip 22 are both an integrated circuit (IC) chip.

For example, the first chip 21 includes a coil driving circuit unit, and the second chip 22 includes a receiving circuit unit. A high-frequency signal is transmitted to the first coil portion 112 through the electrical connection between the coil driving circuit unit and the first coil portion 112, and the second coil portion 122 receives a high-frequency voltage through the electrical connection between the receiving circuit unit and the second coil portion 122. Alternatively, in another embodiment, the first chip 21 can include the receiving circuit unit and the second chip 22 can include the coil driving circuit unit.

Therefore, the input signal input from the coil driving circuit unit can be transmitted to the output end (the receiving circuit unit) through the effective magnetic coupling generated by the alignment between the first coil portion 112 and the second coil portion 122 in horizontal direction. Specifically, the first coil portion 112 of the first leadframe 11 and the first chip 21 together form a first closed circuit through a part of the first connecting wires 211. Inputting a current into the first closed circuit can generate a high frequency alternative current magnetic field. The high frequency magnetic field forms a high frequency alternative current in a second closed circuit formed by the second coil portion 122 of the second leadframe 12, the second chip 22 and some of the second connecting wires 221 through the magnetic coupling between the first coil portion 112 and the second coil portion 122. Therefore, electrical signals can be transmitted from the first chip 21 (e.g., an emitter) to the second chip 22 (e.g., a receiver) electrically isolated from the first chip 21.

The manner for disposing (mounting) the first chip 21 and the second chip 22 in step S102 is not limited in the present disclosure. In addition, in step S102, a plurality of first connecting wires 211 and a plurality of second connecting wires 221 can be disposed along with the first chip 21 and the second chip 22. For example, the first connecting wires 211 and the second connecting wires 221 can be disposed between the first chip 21, the second chip 22, the first chip-mounting portion 111, the second chip-mounting portion 121, the first coil portion 112, the second coil portion 122, the first pins 113 and the second pins 123 by wire-bonding processes.

Next, reference is made to FIG. 6. In step S103, at least one bending portion S can be formed in the first leadframe 11. In fact, in the present disclosure, the bending portion S can be formed in the first leadframe 11 or in the second leadframe 12. In other words, the method provided by the present disclosure can include forming at least a bending portion S on at least one of the first leadframe 11 and the second leadframe 12. In the embodiment shown in FIG. 6, the bending portion S is formed between the first pin portion 113 and the first coil portion 112, and between the first pin portion 113 and the first chip-mounting portion 111. For example, the bending portion S can be formed by bending the first floated pins 114. The formation of the bending portion S can prevent the first coil portion 112 and the second coil portion 122 from contacting with each other in the subsequent steps, and prevent the first chip 21 disposed on the first chip-mounting portion 111 and the second chip 22 disposed on the second chip-mounting portion 121 from contacting with each other.

As long as the object of preventing the contact between the first leadframe 11 and the second leadframe 12 in the final product, i.e., ensuring the electrical isolation between the first leadframe 11 and the second leadframe 12, is achieved, the dimensions of the bending portion S and the direction for bending the first floated pins 114 can be adjusted. Specifically, the specific parameters of the bending portion S can be designed based on the method and properties such as magnetic coupling and voltage insulation of a target product. For example, the bending direction of the bending portion S can be determined based on the rotation direction of the first leadframe 11 in step S104.

As shown in FIG. 6, in this embodiment, the bending portion S is formed in the first leadframe 11. Referring to FIG. 1, before forming the bending portion S, the plurality of first pins 113 and the plurality of first floated pins 114 located at the junction of the first leadframe 11 and the second leadframe 12 can be bent downwardly by cutting the first leadframe 11 along the cutting lines A. In other words, in FIG. 1, the plurality of first pins 113 and the plurality of first floated pins 114 located at the right side of the two cutting lines A can be bent (towards a direction away from the viewer) for allowing the second chip-mounting portion 121 and the second coil portion 122 located at the left side of the two cutting lines A to move to another plane (away from the viewer).

As mentioned above, the first chip-mounting portion 111 for carrying the first chip 21 and the first coil portion 112 are lowered to a plane away from the second leadframe 12. In other words, based on the design of the bending portion S, the first chip-mounting portion 111 and the first coil portion 112 are moved downwardly to produce a height difference d between a portion of the first leadframe 11 and the second leadframe 12, thereby allowing the first coil portion 112 and the second coil portion 122 to be spaced apart from each other by a distance equal to the height difference d.

The height difference d can be designed based on the properties of the target product, such as the magnetic coupling and voltage insulation properties. In other words, by adjusting the height difference d, the isolation voltage between the two leadframes and the magnetic coupling strength between the two coil portions can be adjusted. In the present disclosure, the height difference d preferably ranges between 100 and 500 micrometers. In other words, in the target product (a leadframe component of a magnetic coupling package structure), the distance between the first coil portion 112 and the second coil portion 122 is preferably from 100 to 500 micrometers. Therefore, the isolation voltage and the magnetic coupling efficiency between the first coil portion 112 and the second coil portion 122 can be ensured, and the size of the target product can be reduced.

Reference is made to FIG. 7. In step S104, the first leadframe 11 is rotated relative to the frame body 10 and moved to a position above or under the second leadframe 12 for matching the first coil portion 112 with the second coil portion 122 and generating magnetic coupling. Specifically, as shown in FIG. 1, the first leadframe 11 is rotated along the rotating axis B and toward the rotation direction R for 180 degrees. Therefore, the first leadframe 11 is moved to a position above the second leadframe 12. The position of the lead frame structure 1 is unchanged during step S104.

It should be noted that if the bending portion S is formed by bending the first pin portion 113 of the first leadframe 11 downward as in step S103, the first leadframe 11 will be rotated and moved to a position above the second leadframe 12 in step 104 for preventing the first chip 21 and the second chip 22 from contacting with each other, or preventing the first coil portion 112 and the second coil portion 122 from contacting with each other. Similarly, if the bending portion S is formed by bending the first pin portion 113 of the first leadframe 11 upward as in step S103, the first leadframe 11 will be rotated and moved to a position under the second leadframe 12 in step S104. In other words, the step for forming the bending portion S and the step for rotating the first leadframe 11 are correlated with each other.

Based on step S104, the first coil portion 112 of the first leadframe 11 and the second coil portion 122 of the second leadframe 12 has a height difference d formed by the bending portion S therebetween. As mentioned above, by controlling the value of the height difference d, the coupling and voltage insulation efficiency of the leadframe component or the magnetic coupling package structure formed thereby can be adjusted. In addition, the step for rotating the first leadframe 11 can be achieved in a single step, i.e., rotating the first leadframe 11 for 180 degrees in a single movement, or can be achieved through multiple steps, i.e., rotating the first leadframe 11 for different or same angles in each step.

In the embodiment shown in FIG. 5 to FIG. 8, after completing step S104, the first coil portion 112 is located at a position right above the second coil portion 122 and is parallel to the second coil portion 122 as shown in FIG. 8. In addition, the first coil portion 112 and the second coil portion 122 are aligned with each other, thereby ensuring the coupling effect between the first coil portion 112 and the second coil portion 122. In addition, the first coil portion 112 and the second coil portion 122 have a nonconductive spacing (equal to the height difference d) therebetween.

Figure 9:
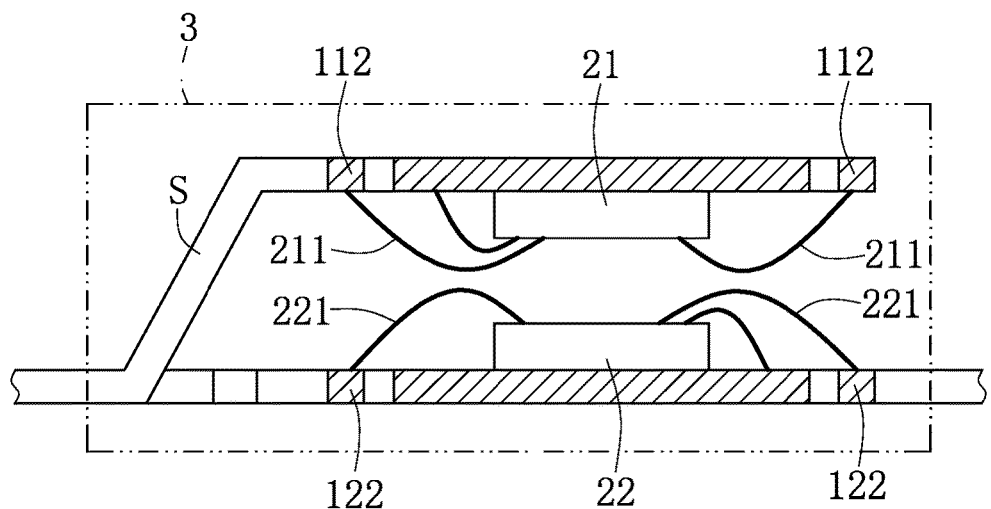
FIG. 9 is a schematic view of a package structure of a folding magnetic coupling isolator provided by an embodiment of the present disclosure.

After matching the first coil portion 112 with the second coil portion 122, step S105 can be performed to form an insulating package structure 3 for molding the first chip 21 and the second chip 22, and for connecting the first leadframe 11 to the second leadframe 12. As shown in FIG. 9, the insulating package structure 3 encloses the first chip-mounting portion 111 and the first coil portion 112 of the first leadframe 11, the second chip-mounting portion 121 and the second coil portion 122 of the second leadframe 12, and the first chip 21 and the second chip 22 respectively disposed on the first chip-mounting portion 111 and the second chip-mounting portion 121. A portion of the insulating package structure 3 is filled in (disposed) between the first leadframe 11 and the second leadframe 12 for insulating the first coil portion 112 from the second coil portion 122.

In addition, a portion of each of the first pins 113 are exposed from the insulating package structure 3, and a portion of each of the second pins 123 are exposed from the insulating package structure 3. A portion of the first floated pins 114 is exposed from the insulating package structure 3, and a portion of the second floated pins 124 is exposed from the insulating package structure 3. The portion of the first pins 113 and the portion of the second pins 123 exposed from the insulating package structure 3 can be electrically connected to other electronic components. For example, the portion of the first pins 113 and the portion of the second pins 123 can provide the required isolating voltage to the magnetic coupling package structure.

Referring to FIG. 4, after step S105, the method provided by the embodiments of the present disclosure further includes a step of removing the frame body 10. Specifically, the frame body 10 is used to support the first leadframe 11 and the second leadframe 12 during the manufacturing process. After an insulating package structure 3 is provided to connect the first leadframe 11 to the second leadframe 12, the frame body 10 can be deflashed, trimmed and formed, and then removed. The process for removing the frame body 10 is not limited in the present disclosure. During the step of removing the frame body 10, the first floated pins 114 and the second floated pins 124 exposed from the insulating package structure 3 can be removed. It should be noted that in the present disclosure, the direction for removing (cutting) the first floated pins 114 and the second floated pins 124 can be opposite to each other (both are removed along a direction away from the center of the semiconductor package) for increasing the isolation distance, thereby ensuring the isolation voltage.

It should be noted that in the present disclosure, a step for disposing a polyimide film between the first leadframe 11 and the second leadframe 12 can be included for increasing the isolation voltage. In other words, the polyimide film can increase the electrical isolation efficiency between the first leadframe 11 and the second leadframe 12. In addition, by disposing the polyimide film, the height difference (i.e., the distance of the spacing) between the first coil portion 112 and the second coil portion 122 can be effectively reduced to from 100 to 200 micrometers. Therefore, the magnetic coupling efficiency can be increased while ensuring the isolation voltage.

Figure 10:
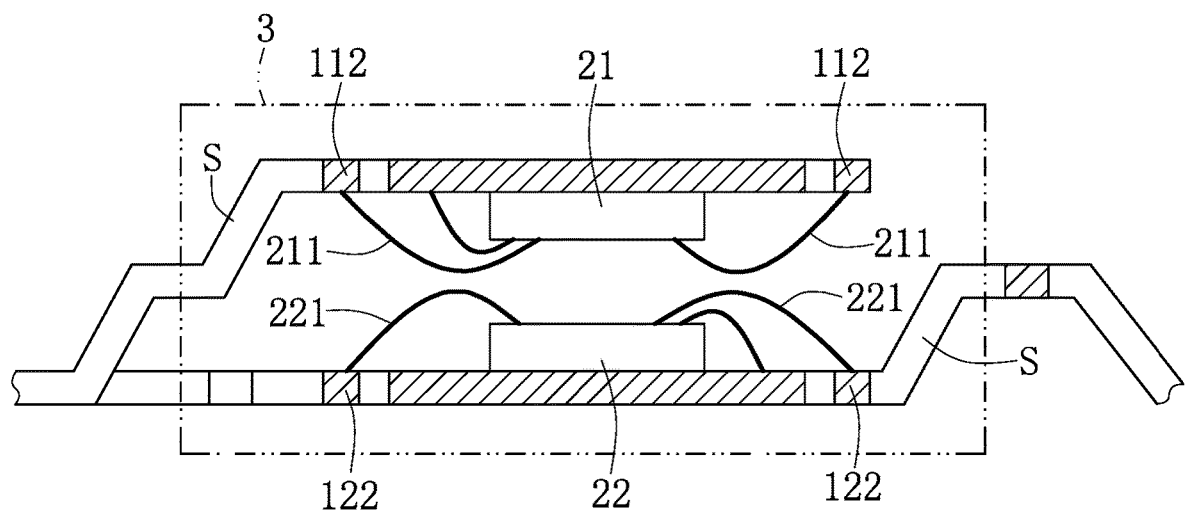
FIG. 10 is a schematic view of a package structure of a folding magnetic coupling isolator provided by another embodiment of the present disclosure.
Figure 11:
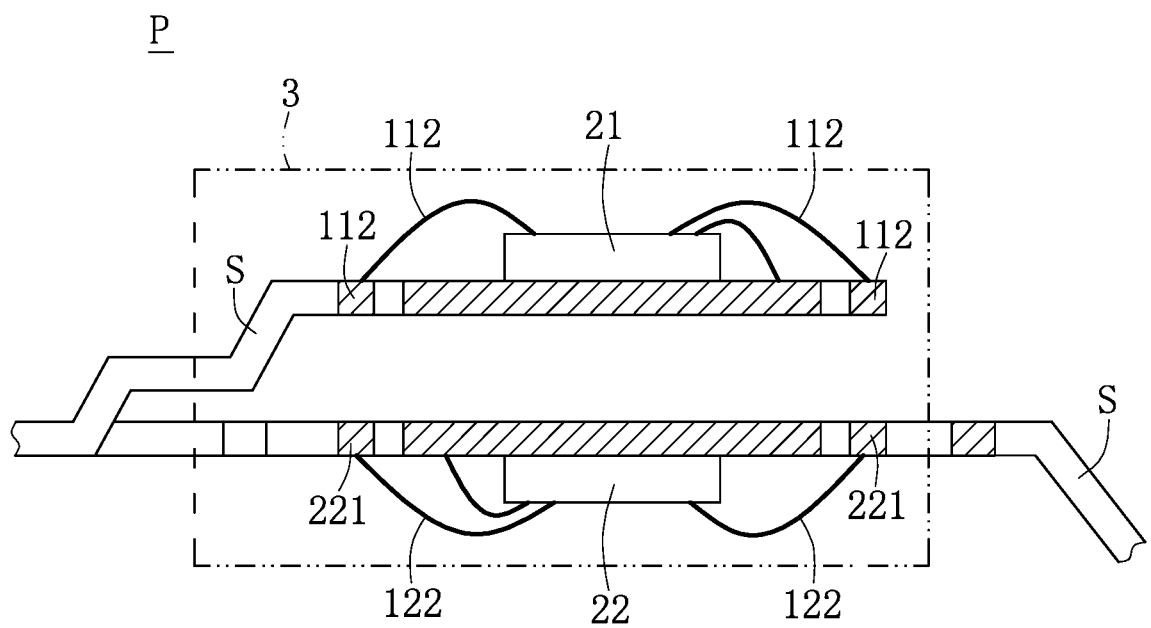
FIG. 11 is a schematic view of a package structure of a folding magnetic coupling isolator provided by yet another embodiment of the present disclosure.

Reference is made to FIG. 10 and FIG. 11. Compared to the embodiment shown in FIG. 9, the magnetic coupling package structure P of the embodiment shown in FIG. 10 and FIG. 11 has a different number of bending portions S, and the positions of the first chip 21 and the second chip 22 are also different. Specifically, as shown in FIG. 10, in addition to the bending portion S formed on the first pin portion 113 of the first leadframe 11, the second pin portion 123 of the second leadframe 12 also has a bending portion S formed thereon. In other words, the distance between the first coil portion 112 and the second coil portion 122 can be adjusted by forming bending portions S on the first pin portion 113, the first floated pin 114, the second pin portion 123 and the second floated pin 124.

Compared to FIG. 9 and FIG. 10, in the embodiment shown in FIG. 11, the arrangement of the first chip 21 and the second chip 22 is different. Specifically, in FIG. 11, the first chip 21 and the second chip 22 are respectively disposed on two chip-mounting portions facing towards opposite directions. In other words, compared to FIG. 10, in which the two surfaces having the first chip 21 and the second chip 22 mounted thereon in the magnetic coupling package structure P are arranged face to face, the first chip 21 and the second chip 22 in FIG. 11 are arranged back to back. Therefore, the height difference d can be reduced, and the magnetic coupling efficiency can be increased. In fact, the arrangements of the first chip 21 and the second chip 22 is not limited in the present disclosure.

The present disclosure further provides a leadframe component and a magnetic coupling package structure. The leadframe component and the magnetic coupling package structure P can be formed by the method described above. Therefore, the details of the leadframe component and the magnetic coupling packages structure are not reiterated herein.

Effects of the Embodiments

One of the advantages of the present disclosure resides in that, based on the technical features of "the first leadframe 11 is disposed above or under the second leadframe 12 for aligning the first coil 112 and the second coil 122 and enabling the first coil 112 and the second coil 122 to magnetically couple to each other" or "rotating the first leadframe 11 relative to the frame body 10 for moving the first leadframe 11 to a position above or under the second leadframe 12", the foldable leadframe component, a package structure of a magnetic coupling isolator P including the same and a method for manufacturing the package structure provided by the present disclosure can improve the alignment accuracy of the first coil portion and the second coil portion and control the magnetic coupling effect generated by the matching of the first coil portion and the second coil portion.

Specifically, the package structure of the magnetic coupling isolator P provided by the present disclosure can be used in semiconductor package elements such as microtransformer. In addition, the package structure can be manufactured by a simple method and be based on the specific structural design of the leadframe structure for achieving the effect of automatic alignment of the coils located in different areas (the first leadframe 11 and the second leadframe 12) in a single leadframe structure 1. Furthermore, by using the insulating package 3, the first coil portion 112 and the second coil portion 122 are highly insulated from each other. The package structure of a foldable magnetic coupling isolator P can have an insulation voltage larger than 5 kV.

In the present disclosure, the first coil portion 112 and the second coil portion 122 are aligned vertically and form effective magnetic coupling, thereby enabling the signals to be transmitted from an input (such as a reflector) to an output (such as a receiver) through the coupling of the coils. In addition, the vertical distance between the first coil portion 112 and the second coil portion 122 can be controlled by changing the design of the leadframe structure 1. For example, by adjusting the distance between the first leadframe 11 with the first coil portion 112 located thereon and the second leadframe 12 with the second coil portion 122 located thereon, the performance of the electrical insulation of the two coils can be adjusted.

The above-mentioned descriptions represent merely the exemplary embodiment of the present disclosure, without any intention to limit the scope of the present disclosure thereto. Various equivalent changes, alterations or modifications based on the claims of the present disclosure are all consequently viewed as being embraced by the scope of the present disclosure.

What is claimed is:

1. A leadframe component, comprising:
   a first leadframe including a first chip-mounting portion for carrying a first chip, a first coil portion, a plurality of first pins and a plurality of first floated pins; and
   a second leadframe including a second chip-mounting portion for carrying a second chip, a second coil portion, a plurality of second pins and a plurality of second floated pins;
   wherein the first leadframe is disposed above or under the second leadframe for aligning the first coil portion with the second coil portion.

2. The leadframe component according to claim 1, wherein the first coil portion and the second coil portion have a height difference of from 100 micrometers to 500 micrometers therebetween.

3. The leadframe component according to claim 1, wherein one of the first leadframe and the second leadframe comprises at least one bending portion.

4. The leadframe component according to claim 3, wherein the at least one bending portion is formed between the first pin and the first coil portion, and between the first pin and the first chip-mounting portion.

5. The leadframe component according to claim 4, wherein the other one of the first leadframe and the second leadframe comprises at least another one bending portion formed between the second pin portion and the second coil portion, and between the second pin portion and the second chip-mounting portion.

6. A package structure of a folding magnetic coupling isolator, comprising:
  a first leadframe including a first chip-mounting portion, a first coil portion, a plurality of first pin and a plurality of first floated pins;
  a second leadframe including a second chip-mounting portion, a second coil portion, a plurality of second pins and a plurality of second floated pins;
  a first chip disposed on the first chip-mounting portion;
  a second chip disposed on the second chip-mounting portion; and
  an insulating package enclosing the first chip and the second chip, and connecting the first leadframe to the second leadframe, wherein a portion of each of the first pins is exposed from the insulating package and a portion of each of the second pin is exposed from the insulating package;
  wherein the first leadframe is disposed above or under the second leadframe for aligning the first coil portion with the second coil portion and enabling the first coil portion and the second coil portion to magnetically couple to each other;
  wherein the first leadframe and the second leadframe are electrically isolated from each other.

7. The package structure according to claim 6, wherein the first chip and the first coil portion forming a first closed circuit through a first connecting wire, the second chip and the second coil portion forming a second closed circuit through a second connecting wire.

8. The package structure according to claim 6, wherein the first chip includes a coil driving circuit unit and the second chip includes a receiving circuit unit, and a high frequency signal is transmitted to the first coil portion by an electrical connection between the coil driving circuit unit and the first coil portion, and the second coil portion receives a high frequency voltage by an electrical connection between the receiving circuit unit and the second coil portion.

9. The package structure according to claim 6, wherein the first chip and the second chip are disposed facing each other or opposite directions from each other.

10. The package structure according to claim 6, wherein one of the first leadframe and the second leadframe comprises at least one bending portion.

11. The package structure according to claim 10, wherein the at least one bending portion is formed between the first pin and the first coil portion, and between the first pin and the first chip-mounting portion.

12. The package structure according to claim 11, wherein the other one of the first leadframe and the second leadframe comprises at least another one bending portion formed between the second pin portion and the second coil portion, and between the second pin portion and the second chip-mounting portion.

13. The package structure according to claim 10, wherein a polyimide film is disposed between the first leadframe and the second leadframe.

14. The package structure according to claim 13, wherein the first coil portion and the second coil portion have a height difference of from 100 micrometers to 200 micrometers therebetween.

15. The package structure according to claim 10, wherein the first coil portion and the second coil portion have a height difference of from 100 micrometers to 500 micrometers therebetween.

16. A leadframe structure of a folding magnetic coupling isolator, comprising:
  a frame body;
  a first leadframe including a first chip-mounting portion for carrying a first chip, a first coil portion, a plurality of first pins and a plurality of first floated pins;
  a second leadframe including a second chip-mounting portion for carrying a second chip, a second coil portion, a plurality of second pins and a plurality of second floated pins;
  wherein the first leadframe and the second leadframe are both connected to the frame body; and wherein the first coil portion and the second coil portion are respectively connected to the plurality of the first floated pins and the plurality of the second floated pins;
  wherein the first chip-mounting portion in the first leadframe is surrounded by the first coil portion, and the second chip-mounting portion in the second leadframe is surrounded by the second coil portion.

17. The leadframe structure according to claim 16, wherein the first chip-mounting portion and the first coil portion in the first leadframe are separated from and adjacent to each other, and the second chip-mounting portion and the second coil portion in the second leadframe are separated from and adjacent to each other.

18. The leadframe structure according to claim 16, wherein the relative position between the first chip-mounting portion and the first coil portion are matched the relative position between the second chip-mounting portion and the second coil portion.

* * * * *